(12) United States Patent
Pedigo

(10) Patent No.: US 6,506,332 B2
(45) Date of Patent: Jan. 14, 2003

(54) FILLING METHOD

(75) Inventor: Jesse L. Pedigo, Chippewa Falls, WI (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/752,503

(22) Filed: Dec. 28, 2000

(65) Prior Publication Data

US 2002/0084556 A1 Jul. 4, 2002

Related U.S. Application Data

(60) Provisional application No. 60/208,454, filed on May 31, 2000, and provisional application No. 60/208,456, filed on May 31, 2000.

(51) Int. Cl.[7] .......................... B29C 70/80; B29C 70/88; B29C 67/08
(52) U.S. Cl. ...................... 264/443; 264/104; 264/267; 427/97
(58) Field of Search .............................. 29/852; 427/96, 427/97; 264/261, 267, 273, 104, 105, 443

(56) References Cited

U.S. PATENT DOCUMENTS

| 3,601,523 A | 8/1971 | Arndt et al. .............. 174/68.5 |
| 4,106,187 A | 8/1978 | Wallis et al. .................. 29/625 |

(List continued on next page.)

FOREIGN PATENT DOCUMENTS

| EP | 0 194 247 A2 | 9/1986 |
| EP | 0 713 358 A2 | 5/1996 |
| EP | 0 723 388 A1 | 7/1996 |
| FR | 2 684 836 | 6/1993 |
| FR | 2 714 567 | 6/1995 |
| GB | 2 120 017 A | 11/1983 |
| GB | 2 246 912 A | 2/1992 |
| GB | 2 341 347 A | 3/2000 |
| JP | 62-277794 | 12/1962 |
| JP | 53-10487 | 9/1978 |
| JP | 58011172 | 1/1983 |
| JP | 62-287696 | 12/1987 |
| JP | 1173696 | 7/1989 |
| JP | 1236694 | 9/1989 |
| JP | 03004595 | 1/1991 |
| JP | 04186792 | 7/1992 |
| JP | 04239193 | 8/1992 |
| JP | 05275819 | 10/1993 |
| JP | 08172265 | 12/1994 |
| JP | 08191184 | 1/1995 |
| JP | 07176871 | 7/1995 |
| JP | 09083135 | 3/1997 |
| JP | 09321399 | 12/1997 |
| JP | 10065339 | 3/1998 |
| JP | 10256687 | 9/1998 |
| JP | 11054909 | 2/1999 |
| WO | WO 86/06243 | 10/1986 |
| WO | WO 00/13474 | 3/2000 |

OTHER PUBLICATIONS

Via Etching Process, Feb. 1972.
Multilayer Printed Circuit Board Connections, Apr. 1996.
Process for Forming Copper Clad Vias, Aug. 1989.

Primary Examiner—Angela Ortiz
(74) Attorney, Agent, or Firm—Rutan & Tucker, LLP; David J. Zoetewey; Robert D. Fish

(57) ABSTRACT

A method for filling vias in an electronic substrate which includes providing a source of fill material; providing a pressure head coupled to the source of fill material via a fill material inlet, the pressure head further comprising an elongated fill material outlet which is substantially larger than the fill material inlet; placing the pressure head in contact with the electronic substrate; and pressurizing the fill material to inject fill material into the vias of the electronic substrate.

15 Claims, 12 Drawing Sheets

U.S. PATENT DOCUMENTS

| | | | | |
|---|---|---|---|---|
| 4,283,243 A | | 8/1981 | Lott et al. ................... 156/237 |
| 4,360,570 A | | 11/1982 | Lott et al. ................... 428/596 |
| 4,622,239 A | | 11/1986 | Wajcik et al. ................ 427/96 |
| 4,700,474 A | | 10/1987 | Choinsk ...................... 29/846 |
| 4,777,721 A | | 10/1988 | Choinski ..................... 29/846 |
| 4,783,247 A | | 11/1988 | Seibel ..................... 204/181.1 |
| 4,884,337 A | | 12/1989 | Choinski ..................... 29/846 |
| 4,954,313 A | * | 9/1990 | Lynch .......................... 419/9 |
| 4,964,948 A | | 10/1990 | Reed .......................... 156/659 |
| 4,995,941 A | | 2/1991 | Nogavich et al. ........... 156/630 |
| 5,053,921 A | | 10/1991 | Nelson ....................... 361/386 |
| 5,058,265 A | | 10/1991 | Goldfard .................... 29/852 |
| 5,117,069 A | * | 5/1992 | Higgins, III ............... 174/261 |
| 5,133,120 A | * | 7/1992 | Kawakami et al. .......... 29/852 |
| 5,145,691 A | * | 9/1992 | Kawakami et al. ........ 425/110 |
| 5,220,723 A | | 6/1993 | Okada ........................ 29/830 |
| 5,274,916 A | | 1/1994 | Minowa et al. .............. 29/848 |
| 5,277,854 A | * | 1/1994 | Hunt .......................... 264/257 |
| 5,332,439 A | * | 7/1994 | Watanabe et al. .......... 118/213 |
| 5,451,721 A | | 9/1995 | Tsuchida et al. ........... 174/261 |
| 5,456,004 A | | 10/1995 | Swamy ....................... 29/852 |
| 5,471,091 A | | 11/1995 | Patrick et al. .............. 257/752 |
| 5,532,516 A | | 7/1996 | Patrick et al. .............. 257/752 |
| 5,540,779 A | | 7/1996 | Andris et al. ............... 118/323 |
| 5,578,151 A | | 11/1996 | Andris et al. ................ 156/64 |
| 5,591,353 A | | 1/1997 | Connally et al. ............. 216/18 |
| 5,610,103 A | | 3/1997 | Xu et al. ..................... 437/225 |
| 5,637,834 A | | 6/1997 | Suppelsa et al. ........... 174/264 |
| 5,662,987 A | | 9/1997 | Tsukada et al. ............. 428/209 |
| 5,699,613 A | | 12/1997 | McMaster .................... 29/852 |
| 5,707,575 A | * | 1/1998 | Litt et al. ................... 264/104 |
| 5,744,171 A | * | 4/1998 | Schneider ................... 425/110 |
| 5,744,285 A | | 4/1998 | Padlewski .................. 430/318 |
| 5,753,976 A | | 5/1998 | Harvey ....................... 257/774 |
| 5,761,803 A | | 6/1998 | Christensen ................. 29/852 |
| 5,766,670 A | | 6/1998 | Arldt et al. .................... 427/8 |
| 5,822,856 A | | 10/1998 | Russell et al. ................ 29/832 |
| 5,824,155 A | | 10/1998 | Perng et al. ................ 118/410 |
| 5,851,344 A | | 12/1998 | Xu et al. ................. 156/379.6 |
| 5,906,042 A | | 5/1999 | Xie et al. ..................... 29/852 |
| 5,925,414 A | | 7/1999 | Buechele et al. ........... 427/282 |
| 5,994,779 A | | 11/1999 | Hause et al. ................ 257/773 |
| 6,000,129 A | | 12/1999 | Russell et al. ................ 29/852 |
| 6,009,620 A | | 1/2000 | Welsh et al. .................. 29/852 |
| 6,015,520 A | * | 1/2000 | Appelt et al. ............... 264/104 |
| 6,079,100 A | | 6/2000 | Schmidt et al. .............. 29/852 |
| 6,090,474 A | | 7/2000 | Papathomas et al. ....... 428/209 |
| 6,106,891 A | | 8/2000 | Sabina et al. ................ 427/97 |
| 6,138,350 A | | 10/2000 | Russell et al. ................ 29/852 |
| 6,149,857 A | * | 11/2000 | McArdle et al. ............ 264/429 |
| 6,153,508 A | | 11/2000 | Harvey ....................... 438/622 |
| 6,184,133 B1 | * | 2/2001 | Iijima et al. ................ 438/667 |
| 6,261,501 B1 | * | 7/2001 | Miyagawa et al. .... 264/272.15 |
| 6,276,055 B1 | | 8/2001 | Bionno et al. ................ 29/852 |
| 6,281,448 B1 | | 8/2001 | Tsokamoto ................. 174/260 |
| 6,282,782 B1 | | 9/2001 | Hu et al. ...................... 29/852 |

* cited by examiner

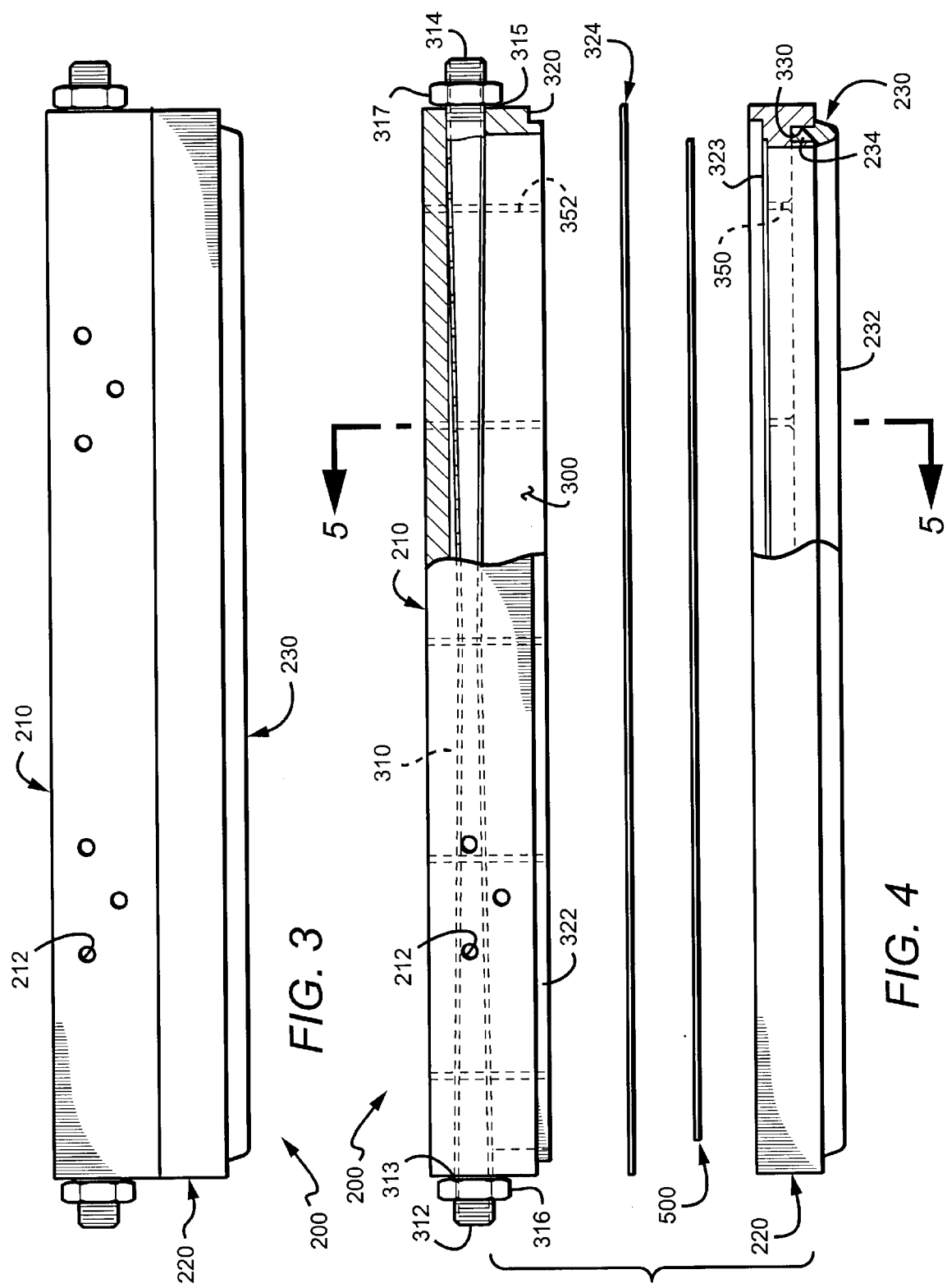

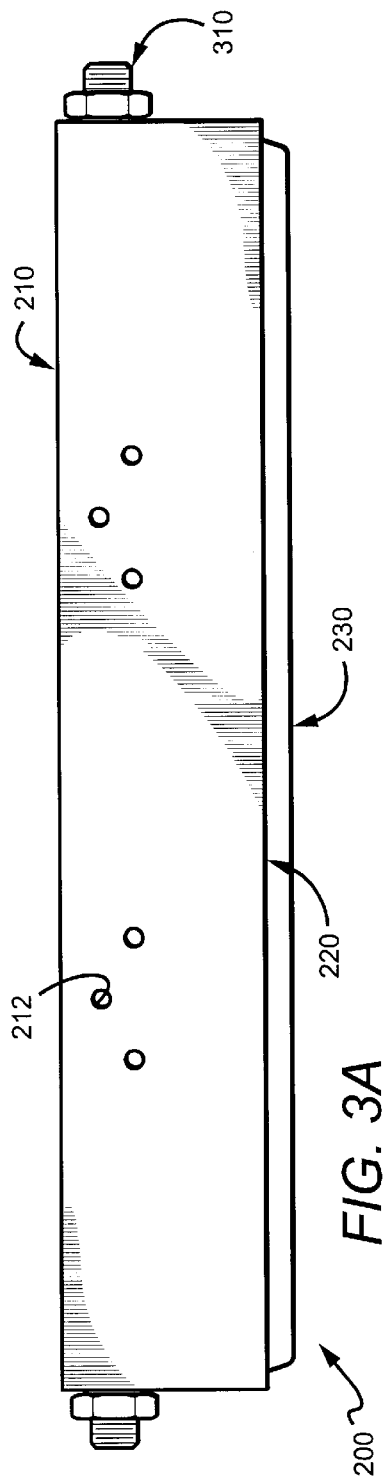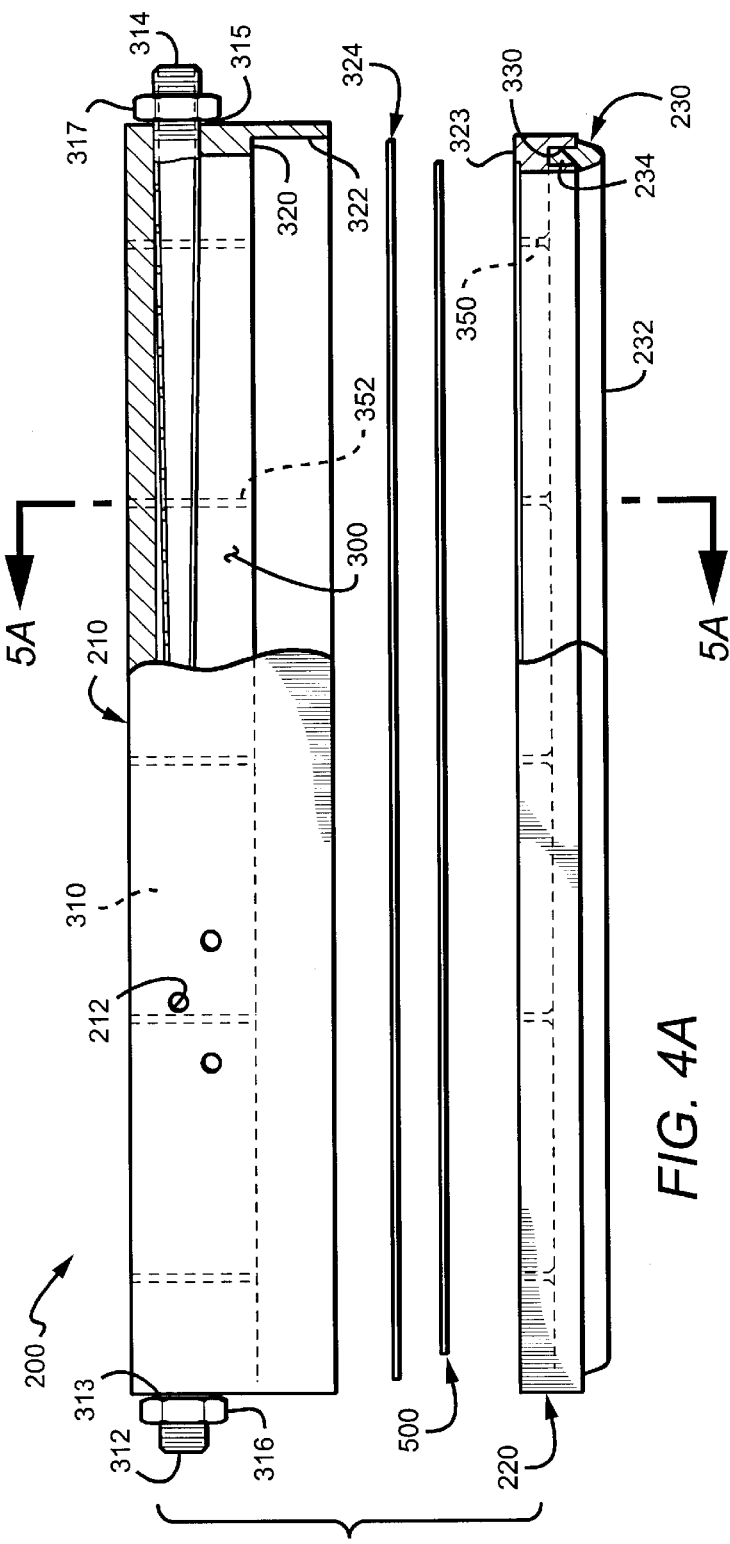

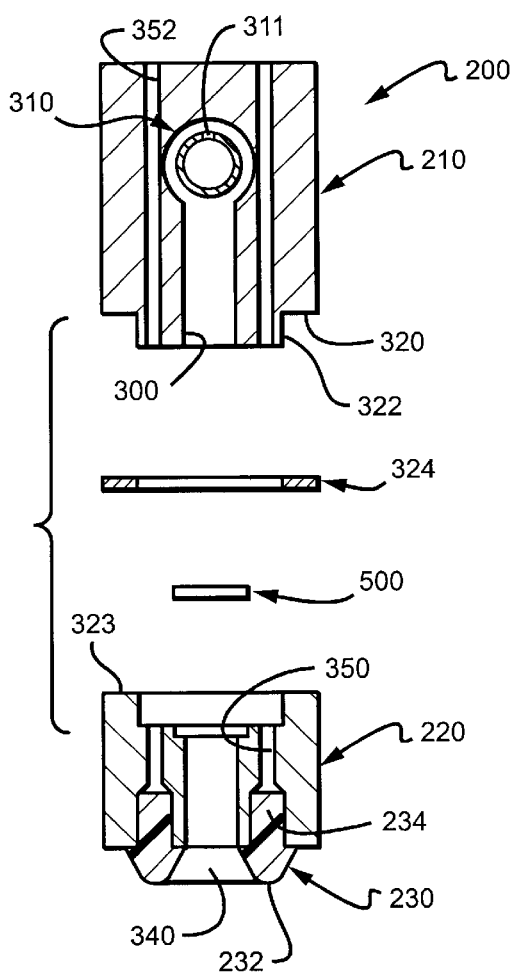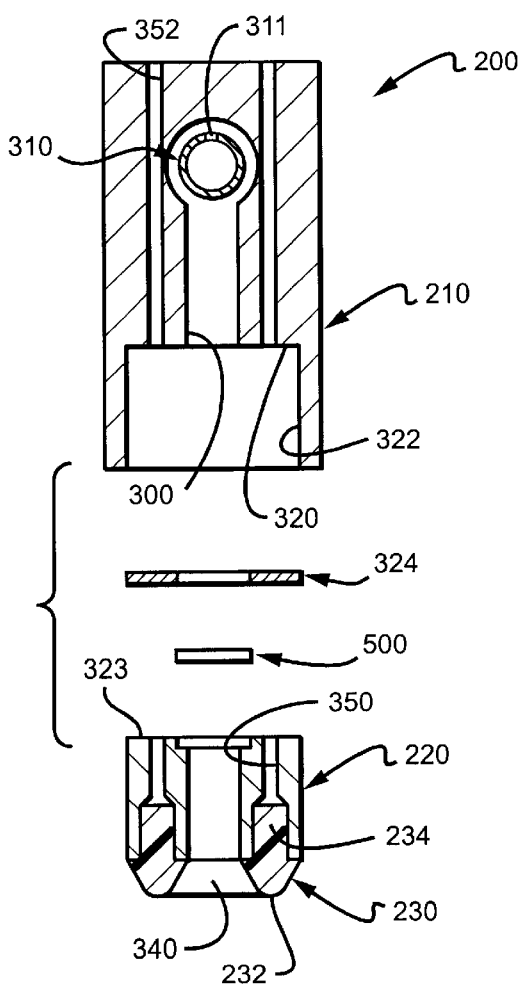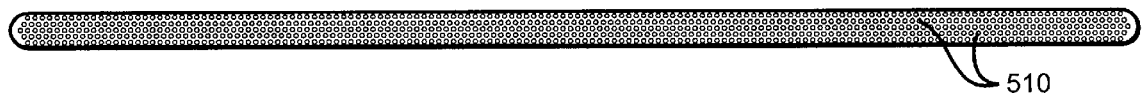

FILLING METHOD

This application claims the benefit of U.S. provisional application No. 60/208,454 and U.S. provisional application No. 60/208,456 both filed May 31, 2000, each of which is incorporated herein by reference in its entirety.

FIELD OF THE INVENTION

The present invention relates to the field of placing fill materials into the vias of an electronic substrate such as by placing electrically conductive, thermally conductive or nonconductive pastes into and onto electronic circuit boards, ceramic substrates and laminate packages. More particularly, this invention deals with placing electrically conductive, thermally conductive or nonconductive pastes into electronic substrate vias that have a very high aspect ratio and small diameters. For future reference we will use the term "substrate" for devices that contain vias/cavities to be filled.

BACKGROUND OF THE INVENTION

A common structure in various electronics packages, such as laminate packages, wired circuit boards, ceramic substrates, and hybrid circuits, is a via. A via is a vertical opening which can be filled with conducting material used to connect circuits on various layers of a substrate or electronics packages to one another. Vias in certain devices may connect to a semiconducting substrate. A via generally starts as an empty cylindrical opening in an electronics package which is formed by drilling. The via is then plated with an electrical conductor such as copper or tin. Plating may be done over the entire panel or device, or may be done with a pattern, dot, or button feature. The plating process results in a via that is an opening with a plated, electrically conductive layer on the inner surface of the opening. Plating may also result in plating all or part of the surface of the device. Plating of the via provides the primary electrical contact at the various layers within the device. The following step is to fill the via with an electrically conductive, thermally conductive or nonconductive paste. The reasons for filling the via after plating include providing a secondary or fail safe electrical connection, or to provide structure integrity, to prevent chemical process entrapment from down-line operations, or to provide thermal conductivity to remove heat from the inner circuit layers of the resulting device. Another reason is that filling the via also controls the breaking of electrical connections formed when the plate or finished electrical device thermally cycles between operating temperatures and non-operating temperatures.

Via filling can occur in the preliminary steps of laminate manufacture, in interim micro-vias, buried vias, blind vias, as well as for pre-gold plate near the end of the end of package/board.

Sequential Build-Up begins with the construction of the "Core Material", meaning a single or multi-layer copper/resin construction having copper foil on the top and bottom surface. The foil can be of varied thickness noted in terms of ounce weight, ½ oz., ⅜ oz. and the like. The core is normally mechanically drilled to meet design specifications, de-burred, then cleaned and plated with copper. These plated vias require filling with material which will then be covered "capped" with a plated conductive material such as copper.

There are some basic approaches to plating the core panels, such as panel plate (non-featured surface), button plate, pattern plate and full build; the first three usually distinguished by electrolytic processes and the last an electroless process. We will briefly expand upon the first three approaches as examples of how the plating features relate to the via fill process. Panel plate affords the easiest method of processing of via fills. The entire surface of the panel is plated, including the drilled vias. Because there is no patterned topography, the via fill material can be directly applied to the surface by squeegee contact or other means without a patterned stencil or screen. This eliminates the need for extremely accurate registration of a stencil to the patterned vias. For both button plate, and pattern plate, a resist image is applied, plated, stripped, then via fill is applied by registered stencil, sometimes aided by a resist. The reason for the resist: patterned vias have a raised land (annular ring) that can vary from 52+ microns wide (typically), and have a thickness of 16 to 52 microns. This creates a gasket problem for the stencil, especially when one has to register to x, y, theta across an 18"×24" panel. There are positive and negative aspects for each of these methods. We'll look at the two most basic ones. Panel plating offers ease of via fill application and leveling by means of planarization, but is limiting in its ability to produce the finer features sought for higher circuit density. Pattern plate offers the better line-space definition, but creates intense registration issues with the stenciled via fill process, and exacerbates any overfilling, or resin bleed-out onto surfaces that must remain pristine. In Japan, the tendency is to panel plate, and also to ease registration issues by reducing panel size. This reduces population and profitability per panel as well. Here in the United States, for the most part manufacturers try all three plate-up processes.

The intent is to uniformly plate the drilled via walls at a satisfactory ratio to the core panel's surface. Quite often plating thickness uniformity can be off, causing varied plated wall thickness, "knee" (excessive plate-up at the top and bottom of the plated via walls). There can also be nodules formed by the plating solution within the vias. These issues can also cause problems with via fill uniformity, especially with the squeegee print filling processes, as material flow is non-uniformly restricted in random vias. The size and depth of the drilled/plated vias will depend on the number of layers within the core panel itself. The thicker the panel, and smaller the via diameter, the more difficult the subsequent plating and via filling operation. There are planarization steps that can be used to help gain surface uniformity, but generally it is best to avoid this step by better plating bath control.

In terms of via fill processing, currently used application methods may lead to potential defects that might be caused by preparation of the materials, or the application method itself. The application method and potential defects will now be discussed.

Squeegee blade application consists of using a metal, polymer, or composite blade to force via fill material through the via holes, using a roll-effect pumping action caused by the squeegee being moved forward at a given angle to that of the substrate under process. This roll effect provides a source for air entrapment within the material, which then forces the air into the via. For aspect ratios greater than 4:1, it is often necessary to perform multiple passes. This process provides additional air pockets in the material that are transferred into the via as voids. Using the squeegee process over bare substrate requires strict control of material volume in front of the squeegee, leaving the process subject to excess variability in material transfer into the vias, and varying air bubble entrapment. In addition, large area exposure of the via fill material may introduce contaminants to the paste. This process normally exhibits excessive material waste, the need to add more paste to replenish volume in front of the squeegee, (additional air entrapment), and can lead to divot or material drag-out caused by the trailing edge of the squeegee, leading to poor leveling. Leveling ( by sanding) becomes non-uniform.

Squeegee over imaged resist results in slightly reduced waste, since there is less material to planarize. However, this process has the same problems as above, with slightly less divot potential. Furthermore, there is a possibility of co-cure of resist, which can lead to strip problems.

Squeegee over stencil provides slightly improved control over material waste and allows two-way printing, but also requires accurate optics/registration to meet typical theta specification(s) for HDI. A stencil increases the potential for air entrapment. Gasketing over via annular rings becomes an issue since loss of fluid pressure over a via may lead to incomplete filling. A single pass fill is required, or an air pocket equal to the stencil aperture volume is forced into the via.

Squeegee over emulsed/imaged screen improves gasketing, but introduces pattern stretch. The screen mesh used greatly increases air entrapment. The screen emulsion compatibility with fill material may also be an issue. Registration repeatability becomes more difficult and a single pass is required to avoid additional air pockets.

As discussed above, the current manufacturing processes associated with filling vias with paste has several problems. In the past it has been difficult to reliably place paste in a via without forming an air pocket or void. The via must be completely filled with paste so that there are no air pockets. If there are voids or air pockets in the paste, these air pockets generally remain in the completed product. A via with a void has several adverse effects. If the paste is placed to provide thermal conductivity, the air of the void is an insulator. If the paste is placed to provide electrical conductivity, if an open should occur at the void there will be no secondary or fail safe electrical connection that can be formed. Furthermore, if the via is filled to provide structural integrity, a void in the via provides for less structural integrity.

Among the effects are that air acts as an insulator, not being as conductive as the paste or plating material. As a result, a via with a void is not as electrically conductive as a via completely filled with conductive materials. The void could also result in an open contact. In addition, the void is within the via and cannot be seen, may produce a micro pin-hole which can hold process fluid contaminants. In addition, air acts as an insulator with thermally conductive fill materials, and the void reduces the thermal conductivity of the filled via. In some instances, a via that contains an air pocket or void may result in the electronics package failing to meet manufacturing specifications. The electronics package may be rejected. Rework may be possible, but would be time consuming. In other instances, the electronics package may have to be scrapped which would reduce the yield percentage associated with the manufacturing process.

The problems set forth above are magnified when a smaller diameter, higher aspect ratio via is required. Smaller diameter, higher aspect ratio vias are becoming more popular as the miniaturization of electronics packages continues to form more densely populated products. Vias to be filled may range from 2–25 thousandth of an inch in diameter and currently have had a depth to diameter ratio from 1:1 to 10:1. The industry struggles to fill vias with aspect ratios greater than 6:1

Thus, there is a drive to establish a method and apparatus to reliably fill vias since filled vias provide numerous advantages in the developing HDI (High Density Interconnect) and SBU (Sequential Build-Up) technologies.

In addition, the exponential growth of organic laminate package and board production has pressed manufacturers to ever increasing interconnect densities, while shrinking size and cost per unit. A good example of this would be the sheer volume growth of throwaway cell phones. Smaller size, lower cost, and performance are critical for competitive marketing on a global scale. At the same time, the demand for filling of via holes has been rising ever since surface mount technology (SMT) became a PCB industry standard. Inner layers are often filled by resin flow during lamination, and as with Plastic Land Grid Arrays (PLGA's), re-flowed solder materials had been used as a structural reinforcement for plated thru-holes, with the added property of high conductivity for potentially bridging any opens caused by wall cracking or other defects.

The designers of High Density Interconnect (HDI) boards and HDI or, Sequential Build Up (SBU) packages are now relying on the ability to utilize various via fill materials to enhance reliability and performance of their designs. The demand, for the most part, had been for non-conductive via fill materials. The via fill applications were basically intended to have two functions; to prevent carry-over contamination from post-fill processing, and to provide some structural support. Although not a standard industry practice, this application demonstrates an area in which improvements of a via fill material, specifically it's conductivity, will greatly simplify package and board processing. Thus, there is great interest in advantages of thermal and electrically conductive material use for improved reliability. Combined with feature size reduction, the filling of features such as through-holes, blind vias, and via in pad with conductive/non-conductive materials plays an enabling role towards this growth.

In conclusion, there is a need for a method and apparatus for placing paste into via openings in electronic packages so that there are no air pockets formed in the paste. There is also a need for a process and apparatus which can be used to form a plugged via which has a reliable electrical contact and which has favorable thermal characteristics. There is also a need for a process which can improve yield for forming plugged vias in electronic packages. There is still a further need for a manufacturing process which is controllable and which has a higher throughput during manufacturing, such as in a relatively high speed, single pass operation. There is also a need for a process that can be adapted for use with stencil printing machines currently used in the manufacturing process. There is also a need for a device which will lessen the possibility that contaminates will be introduced into the via fill paste. Furthermore, there is a need for a device that can be used to place paste in vias having high aspect ratios and small diameters. There is further need for an apparatus which has added control for filling the vias.

SUMMARY OF THE INVENTION

Devices and methods are disclosed for delivering a fill material, such as electrically and/or thermally conductive paste, and/or electrically/ thermally insulating paste, and/or solder paste to an electronics package or other planar surface where the delivery system includes a pressurized supply of fill material and a pressure head attached to the pressurized supply of fill material. The pressure head includes a main body and a wear portion. Attached to the wear portion is a gasket positioned along one surface of the pressure head.

The pressure head also includes a flow dispersion regulator which includes a punctured feed tube positioned within the main body, the punctured feed tube has a plurality of flow regulating openings. The flow regulating openings in the punctured feed tube are sized to maintain a substantially constant pressure at each of the flow regulating openings. Positioned between the main body and the wear portion is a flow equalization grid. The flow equalization grid includes a multiplicity of openings. Attached to the wear element is a gasket. The pressure source may include one or more hydraulic, pneumatic or mechanically driven pressurizing cylinders, and may include a ram press for back-filling paste vessels. Back-filling is desirable to prevent air entrapment during the paste loading process. The paste flow is also controlled with a vacuum pressure release valve. In some embodiments, a controlled output ultrasonic driver is attached to the pressure head. An output control mechanism is used with the ultrasonic driver.

Advantageously, the paste delivery system is an apparatus which employs a method for placing via fill paste into via openings in electronic packages so that there are reduced numbers of air pockets formed in the via fill paste while decreasing the amount of processing time required per board, providing for the use of a wider variety of fill materials, and minimizing wastage and contamination of fill material. In addition, if air pockets are formed, the air pockets would advantageously have less volume than the air pockets or voids formed using other methods. The apparatus and related processes preferably result in plugged vias which are reliable electrical contacts and have favorable thermal characteristics. The process preferably has improved yields for electronic packages or PCB boards, which use plugged vias. The manufacturing process preferably is controllable and has a higher throughput during manufacturing, as is obtained by decreasing the amount of process time required per board. Such decreases in many instances can result in a process time of less than 30 seconds per board. The process preferably can be adapted for use with stencil printing machines, and/or screen printing machines currently used in the manufacturing process. The device preferably utilizes fluid pressure necessary to overcome varied flow resistance in vias. Furthermore the device preferably uses contact pressure to allow sufficient gasketing on the device under process to maintain internal fluid pressure. Furthermore, the device preferably provides a combination of gasket and internal fluid pressure to restrict surface air entrapment in the paste. Furthermore, the device preferably lessens the chances that contaminates will be introduced into the via fill paste. Furthermore, the device and process preferably can also be used to place via fill paste in vias having high aspect ratios and small diameter with added control for filling the vias. Furthermore, the device preferably can be used for screen-printing resist materials and/or other conductive/non-conductive materials. Furthermore, it is preferred that a relatively low fill material pressure is achievable. It is contemplated that such successful use of lower pressure may result from the use of a flow grid, a dispersion regulator, and the use of multiple sequential pressure chambers within the fill head.

Brief Description of the Drawings

FIG. 3 is a front view, of an assembled pressure head of the paste delivery system of FIG. 1.

FIG. 3A is a front view of an alternative assembled pressure head of the paste delivery system of FIG. 1.

FIG. 4 is a front exploded front view of the pressure head of FIG. 3.

FIG. 4A is a front exploded front view of the pressure head of FIG. 3A.

FIG. 5 is a side exploded cutaway view of the pressure head of FIG. 3.

FIG. 5A is a side exploded cutaway view of the pressure head of FIG. 3A.

FIG. 8 is a top view of a pressure equalizing element of a pressure head.

DETAILED DESCRIPTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Overview

Figure 1:
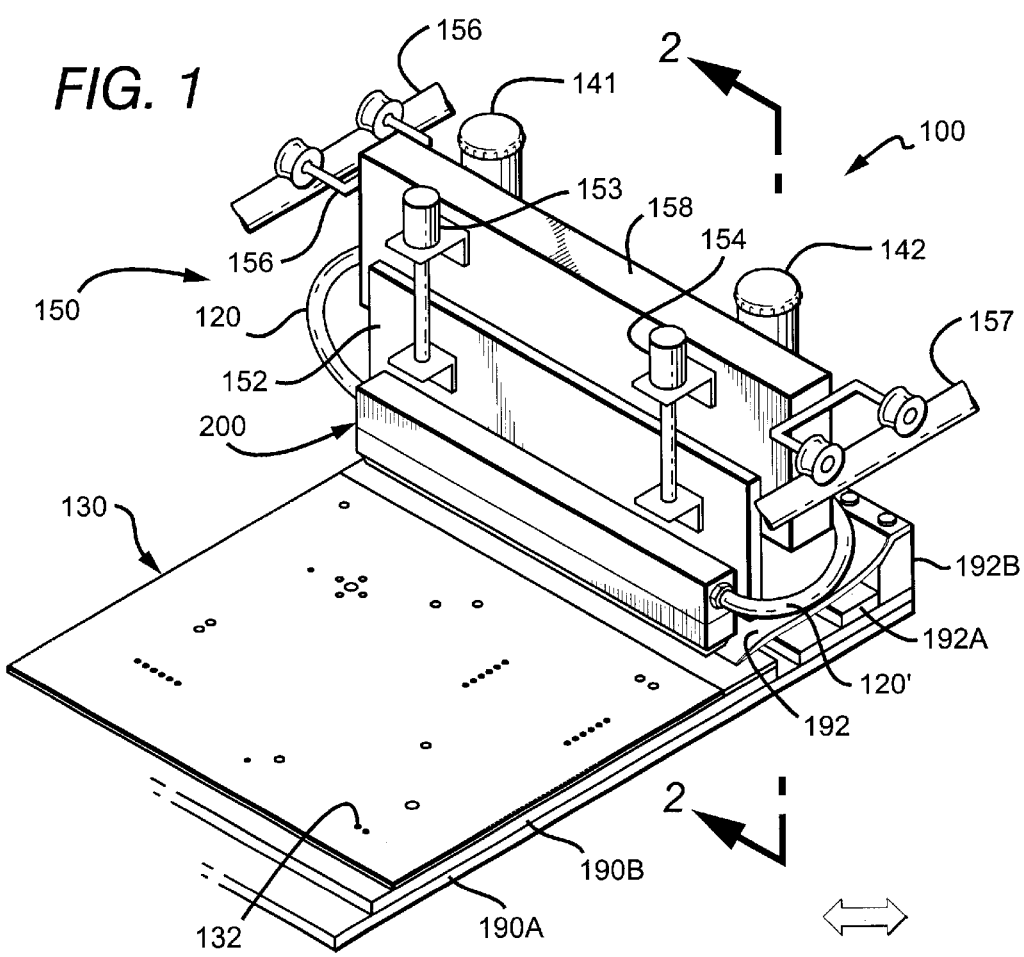
FIG. 1 is a schematic perspective view of a first embodiment of a paste delivery system for delivering pastes to electronics packages.

FIG. 1 is a schematic perspective view of a first embodiment of a paste delivery system 100 for delivering paste to a substrate 130 that includes at least one via 132. The paste delivery system 100 of the first embodiment includes a pressure head 200 attached to a mechanism 150 for moving the pressure head 200. The system also comprises a head parking mechanism 190, and a substrate support structure 180.

The pressure head 200 is placed in contact with and moved across substrate 130 by movement mechanism 150 while fill material is forced through pressure head 200 and into the vias contained in substrate 130. Substrate support structure 180 supports substrate 130 during the fill station, and head parking mechanism 190 helps prevent loss of fill material between passes of pressure head 200 across substrate 130. The fill material is forced through as a result of the pressure head 200 being coupled via feed tubes 120 and 120' to a source of pressurized fill material comprising pressure chambers 141 and 142. Pressure at which the source provides fill material may be referred to hereinafter the fill material pressure.

Pressure Head

FIG. 3 is a front view of an assembled pressure head of the paste delivery system 100 of FIG. 1. The pressure head 200 includes a main body portion 210 and a wear element holding portion 220. Attached to the wear element holding portion 220 is a wear element 230. A flow grid 500 is captured (see FIG. 4) between the main body 210 and the wear element holder 220, and a flow dispersion regulator 132 passes through main body 210. The main body 210, wear element holder 220, and possibly wear element 230 form an elongated narrow pressure chamber 300. FIGS. 4 and 5 provide exploded front and cutaway views of the pressure head of FIG. 3, and FIGS. 3A, 4A, and 5A provide similar views of an alternative embodiment pressure head 200.

The main body 210 and the wear element holding portion 220 may be made from any suitable materials, but are preferably made from materials that will remain inert with respect to the fill material/via fill paste that will pass through the pressure head 200. Examples of such materials include but are not necessarily limited to machine-anodized aluminum, stainless steel, solvent-resistant polymer, and Teflon-impregnated Delrin. In less preferred embodiments, main body 210 and/or wear element holding portion may comprise a composite of materials and/or pieces.

Pressure Head—Main Body

Figure 9:
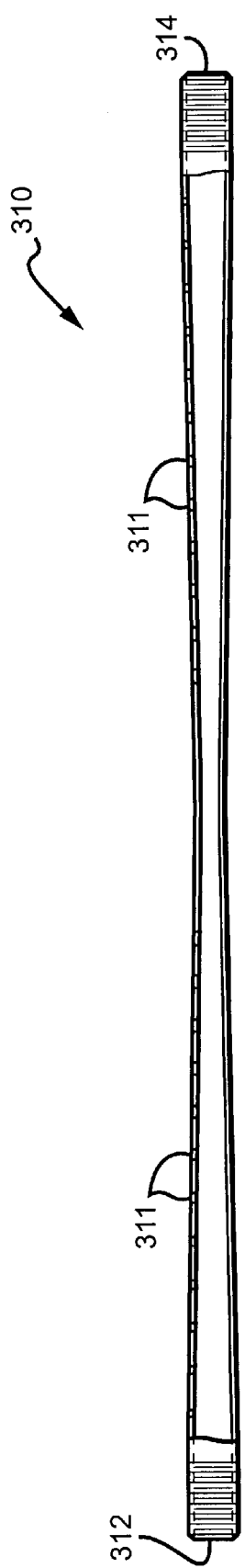
FIG. 9 is a side view of a flow dispersion regulator.

In FIG. 4 and FIG. 5, the main body 210 includes a flow dispersion regulator 310 (shown separately in FIG. 9) which passes through and is in fluid communication with a pressure chamber 300. The flow dispersion regulator 310 comprises a punctured feed tube which is preferably a length of stainless steel tubing having a length longer than the pressure chamber 300, and having openings/orifices 311 along its length.

The stainless steel tubing has a first threaded end 312 and a second threaded end 314 which extend beyond the main body 210 of the pressure head. Near end 312 is O-ring 313 which is used to seal end 312 with respect to the pressure chamber 300. A similar O-ring or seal 315 seals end 314. Nuts 316 and 317 are attached to the threaded end of the flow dispersion regulator 310. Tightening the nuts 316, 317 seals the pressure chamber 300 and fixes the position of the flow dispersion regulator 310. The threads of ends 312, 314 provide a mechanism for attaching supply lines 120, 120' to the ends of the dispersion regulator. Fill material from a pressurized source pass through supply lines 120, 120', through ends 312, 314 into dispersion regulator 310, and out orifices 311 into chamber 300.

It is preferable that the flow path within the dispersion regulator and/or orifices 311 have varying dimensions so as to equalize the pressure at the various openings while via fill paste passes into the pressure chamber 300. In a preferred embodiment, orifices 311 near the ends 312 and 314 are larger than orifices near the center of the main body. In essence, the orifices are made smaller, the nearer they are to the center of the punctured feed tube within the pressure chamber 300 since it is recognized that as the paste flows through the flow dispersion regulator 310, a certain amount of pressure headway is lost. To maintain an equal pressure, the orifice size is decreased near the center of the flow dispersion regulator 310, so that the force per unit area or pressure near the center of the flow dispersion regulator 310 is substantially equal to the pressure found at smaller openings in the flow dispersion regulator near one of the ends 312, 314. The orifices can be placed anywhere along the length of, and can also be placed completely around the circumference of the flow dispersion regulator 310. In addition, the orifices in the flow dispersion regulator 310 can be reoriented by loosening the nuts 316, 317 and rotating the flow dispersion regulator 310. Although the orifices 311 can be facing the wear element portion 220 of the pressure head 200, it is preferred that they face away from wear element portion 220 and towards a wall of chamber 300.

The main body 210 also includes a shoulder 320 which forms a necked-down portion 322. The necked-down portion 322 fits within a similarly sized and dimensioned opening in the wear element holding portion 220 of the pressure head which includes a land 323. A gasket 324 seals the connection between the main body 210 and the wear element holding portion 220. As will be discussed in regard to wear element holder 220, unthreaded opening 352 play a part in coupling wear element holder 220 to the main body 210. In the alternative embodiment of FIGS. 4A and 5A, the wear element holder 220 is inserted within main body 200. Yet another alternative embodiment may utilize a wear element holder 220 having a necked down portion similar to that of the main body of FIG. 210, the necked down portion fitting within a similarly sized and dimensioned opening in the main body 210 of FIG. 5A.

Looking again at FIG. 4, the openings 212 in main body 210 are for mounting the pressure head 200 to guided head support 152 of movement mechanism 150. If the main body 210 is made from a relatively soft material such as aluminum, the openings 210 may be provided with helicoils which are used to provide a threaded opening within a soft material and to prevent stripping of the aluminum by a fastener.

Pressure Head—Wear Element Assembly

Figure 6:
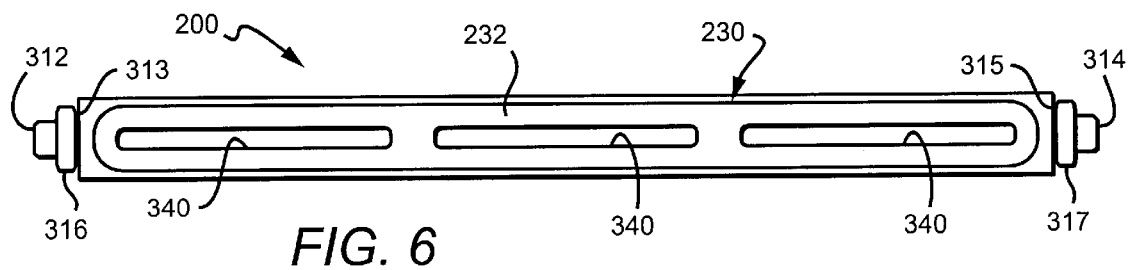
FIG. 6 is a bottom view of a wear element of the pressure head.
Figure 7:
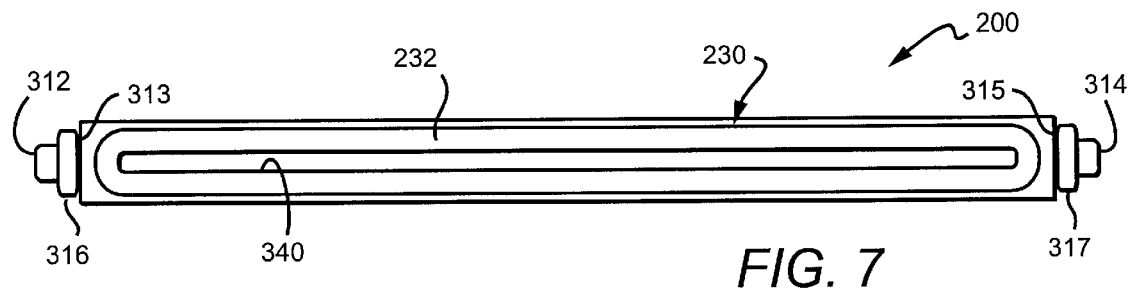
FIG. 7 is a bottom view of an alternative wear element of a pressure head.

Wear element 230 is preferably a gasket or O-ring which is attached to an open end of the wear element holder 220. The open end is generally referred to by reference numeral 340 as shown in FIG. 6 and FIG. 7. Referring to FIG. 5, the wear element 230 preferably includes a rounded tip 232 which contacts a surface of an electronics package 130, as well as an end 234 which is captured within a groove 330 within the wear element holding portion 230. The wear element 230 forms an elongated or oblong opening which can be pressed down to create a suitable seal to the surface of the electronics package 130, that allows for contained paste pressure for proper deposition of fill material.

FIG. 6 is a bottom view of the wear element holding portion 230 of the pressure head 200. FIG. 7 shows an alternative embodiments of the wear element holding portion 230. As can be seen in FIG. 6 and FIG. 7, the wear member 230 comprises one or more elongated and narrow openings 340 through which via fill paste or a similar material will pass when exiting the pressure head 200. It should be noted that the size of the opening(s) 340 can be changed in order to accommodate different patterns of vias on various electronic packages or panels. It is contemplated that different wear element holders 220 and/or wear elements 230 having different sized paste dispensing openings 340 can be attached to a single main body 210. Thus the wear element holding portion can be changed to retool a paste dispensing system 100 for different plates or electronics devices. The size and shape of wear element 230 and wear element holder 220 should such as to help prevent edge distortion of the substrate 130 during application cycles.

It is contemplated that the wear element 230 should be made of a material that has suitable wear characteristics, yet will seal when a fairly low force is applied by the pressure head to the surface of the electronics package. The wear element is preferably machined from Teflon or cast in a mold with 40 to 120+ durometer hardness polymer, or silicon rubber. The wear member 230 can be resurfaced and configured in various lengths and shapes to accommodate different sized print areas for injecting via fill paste to various configurations of vias in electronic packages or panels 130.

In a preferred embodiment, the wear element holding portion includes a threaded opening 350 which corresponds to an unthreaded opening 352 in the main body 210 of the pressure head. Fasteners (not shown) pass through the bore of the unthreaded opening 352 and into the threaded opening 352 to attach the wear element holding portion 230 to the main body 210. It should be noted that there are several similar openings 350 in the wear element holding portion 230 and several similar unthreaded openings 352 within the main body 210, each of which receives a fastener to assemble the pressure head 200. The threaded opening 350 terminates above the groove for holding the wear element 230. Several of the openings 350 in the wear element holder have small extended drill holes through to the groove for holding the wear element or O-ring, to allow placing vacuum into the groove for the purpose of seating the wear part 230. The O-ring 230 can be mounted by placing a vacuum on the unthreaded openings 352 of the main body 210. This produces a vacuum within the groove 330 into which one end of the wear element 230 fits which aids in the mounting of the wear element.

Pressure Head—Flow Grid

FIG. 8 is a top view of the pressure-equalizing element or flow grid 500. The flow grid 500 is located between the main body 210 and the wear element holding portion 230 and helps distribute the fluid flow of the via fill paste or similar material. The flow plate 500 includes a multiplicity of openings 510. As shown in this embodiment, the flow openings 510 are equally spaced and of approximately the same diameter. It should be understood that the flow plate 500 can have openings 510 which are larger or smaller in diameter, and which are in different patterns in order to accommodate varied paste rheologies. The flow grid is interchangeable with alternative flow grids so that different viscosities of via fill paste may be accommodated by use of an appropriate grid.

Flow grid 500 is preferably made of stainless steel and fitted between the main body 210 and the wear element holder 220 of the pressure head 200. More specifically, the necked-down portion 322 of the main body 210 preferably captures the edge of the flow grid 500 between the main body 210 and the wear element 220.

Source of Pressurized Fill Material

Figure 10A:
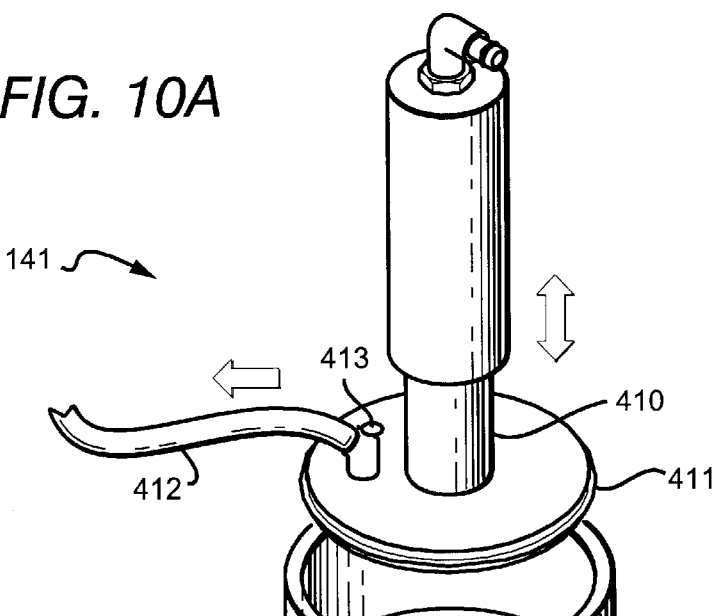
FIG. 10A is a view of one of the pressure chambers of a paste delivery system for delivering pastes of FIG. 1.
Figure 10B:
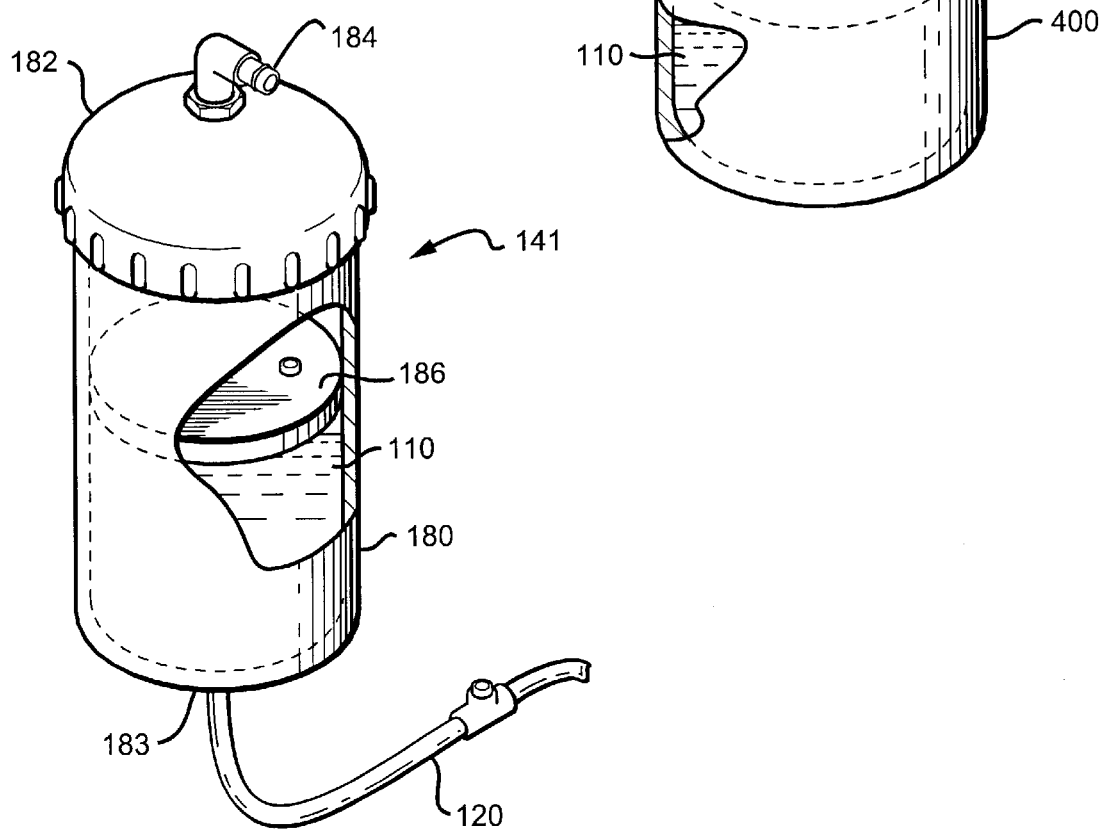
FIG. 10B is a view of a first alternative embodiment of one of the pressure chambers of a paste delivery system for delivering pastes of FIG. 1.
Figure 10C:
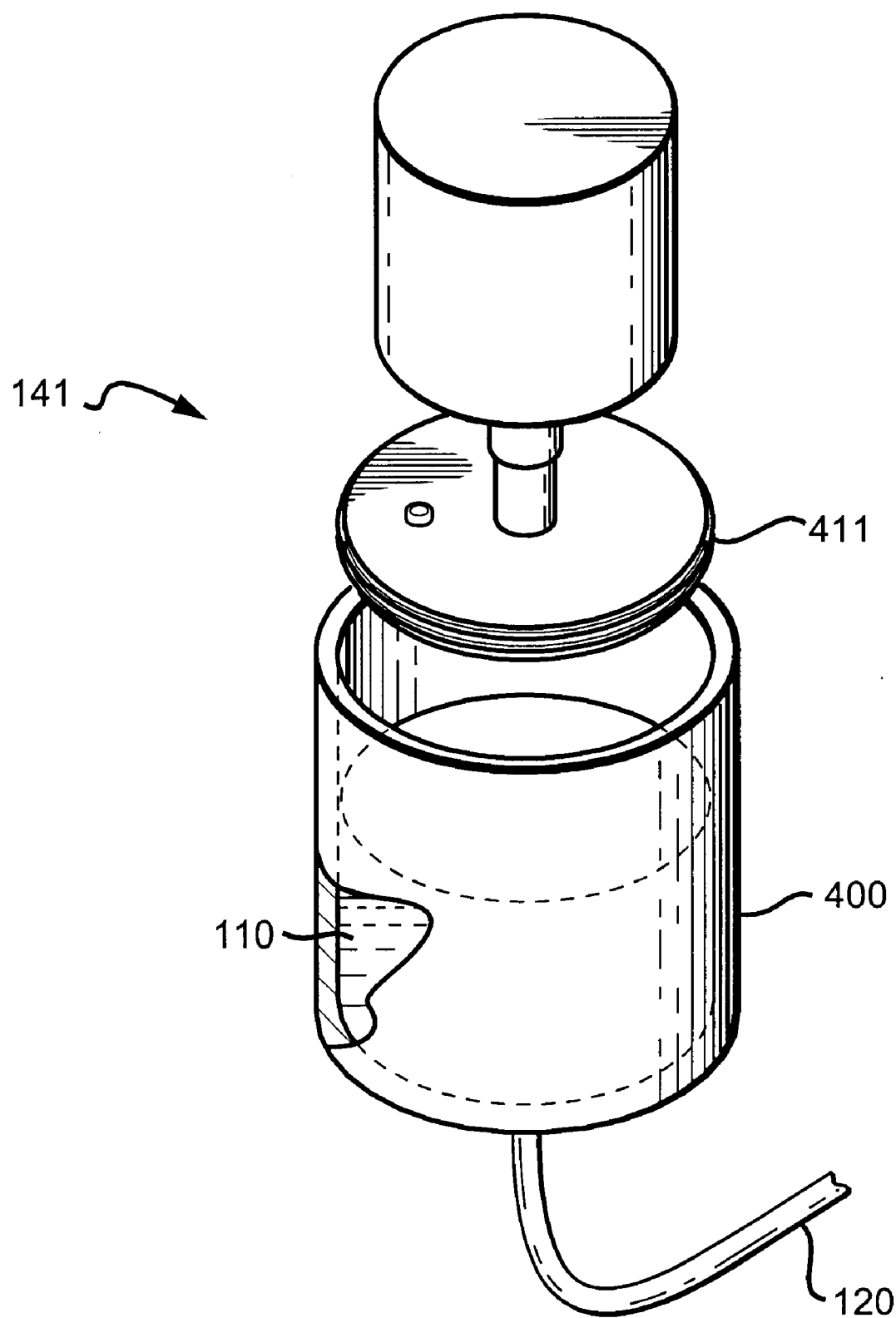
FIG. 10C is a view of a second alternative embodiment of one of the pressure chambers of a paste delivery system for delivering pastes of FIG. 1.

Referring to FIG. 1, the source of pressurized fill material is preferred to comprise a plurality of pressure chambers such as pressure chambers 141 and 142 shown attached to the transverse support member 158 in FIG. 1. FIGS. 10A–10C show alternative pressure chamber designs contemplated for use as chambers 141 and 142.

Referring to FIG. 10A, the pressure chamber 141 or 142 of the paste delivery system 100 includes a backplated ram press chamber which comprises a canister 400 having a piston 410, an 'O' ring seal 411, and a paste feed out tube 412, and air bleed valve 413. Fill material 100 is placed into the canister 400, and capped with the piston 410. Pressure is placed on the piston 410, and the paste is forced out of the feed-out tube 412, with the bleed valve 413 temporarily open to evacuate any trapped air. Once air is removed, the bleed valve 413 is closed, allowing paste flow to the pressure head 200.

Referring to FIG. 10B, an alternative embodiment of the pressure chamber 141 or 142 of the paste delivery system 100 includes an air pressurized calking gun cylinder chamber having vacuum release capability. The pressure chamber 141 includes an outer casing 180 and an inner chamber 181. The pressure chamber 141 includes an outlet end 183 which is attached to feed tube 120. The pressure chamber 141 is capped with a dome-shaped cap 182 which is screwed onto the end of the pressure chamber. The dome-shaped cap includes an air fitting 184. Within the inner chamber 181 is a plunger 186. The plunger is sealed within the inner chamber 181. Paste is positioned between the plunger 186 and the outlet end 183. The plunger 186 caps contains the paste within the inner chamber of the pressure chamber 141.

Figure 2:
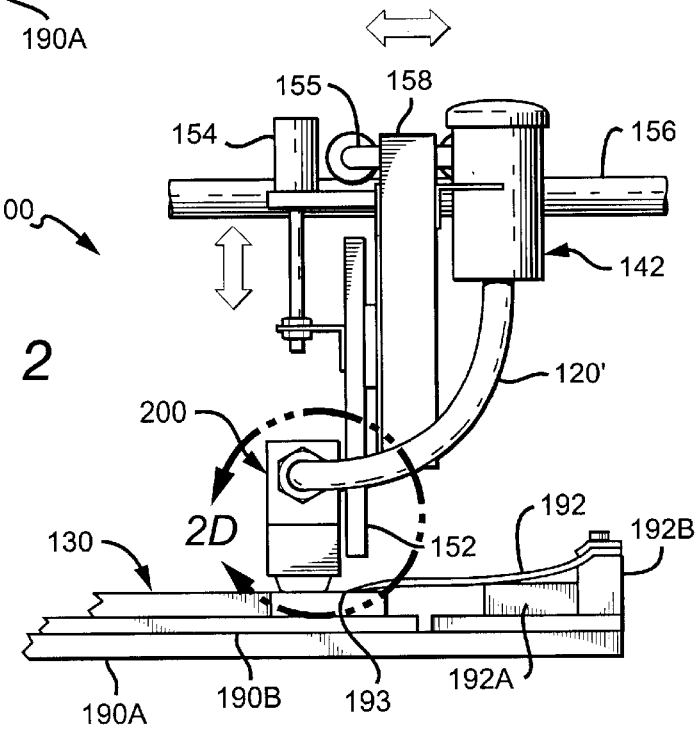
FIG. 2 is a side view of the paste delivery system of FIG. 1.
Figure 2A:
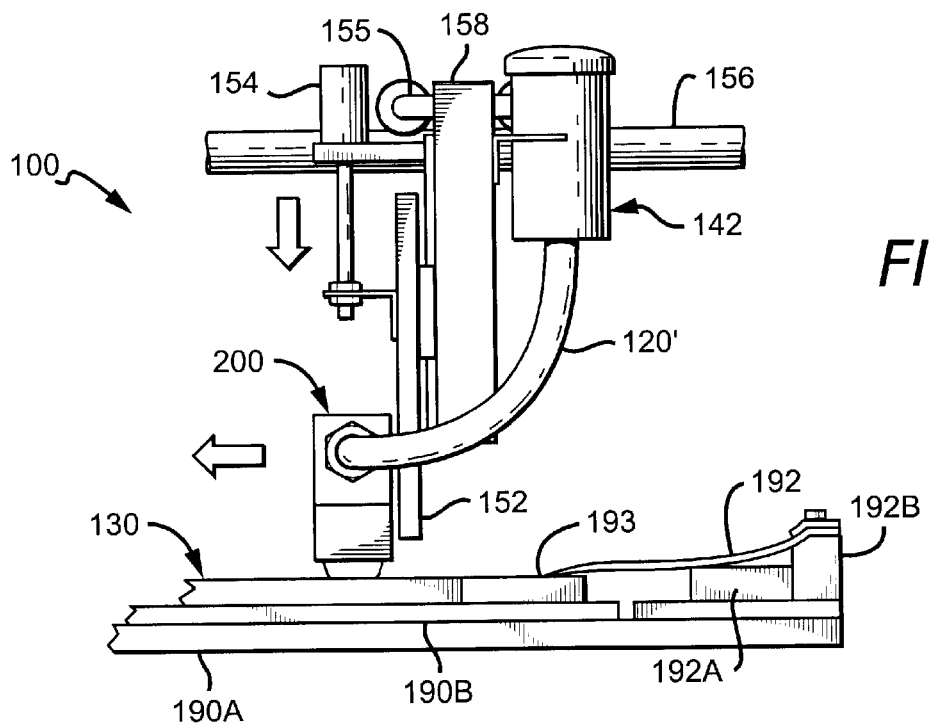
FIG. 2A is a side view of the paste delivery system of FIG. 1 showing a pressure head being moved into contact with and along a substrate away from a parking zone.
Figure 2B:
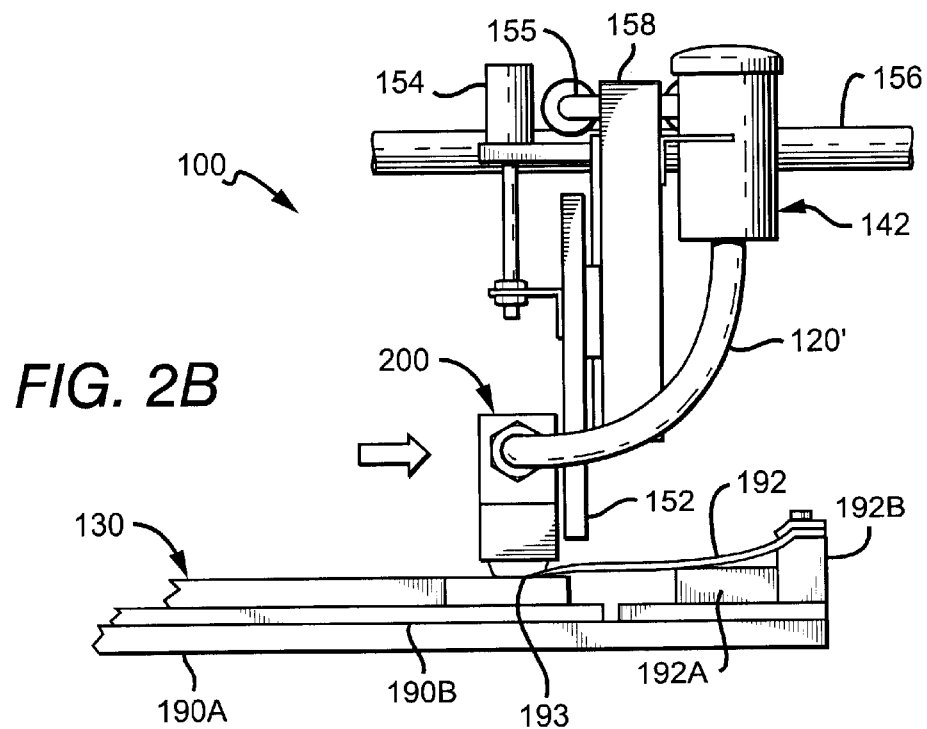
FIG. 2B is a side view of the paste delivery system of FIG. 1 showing a pressure head in contact with a substrate and being moved along the substrate and into a parking zone.
Figure 2C:
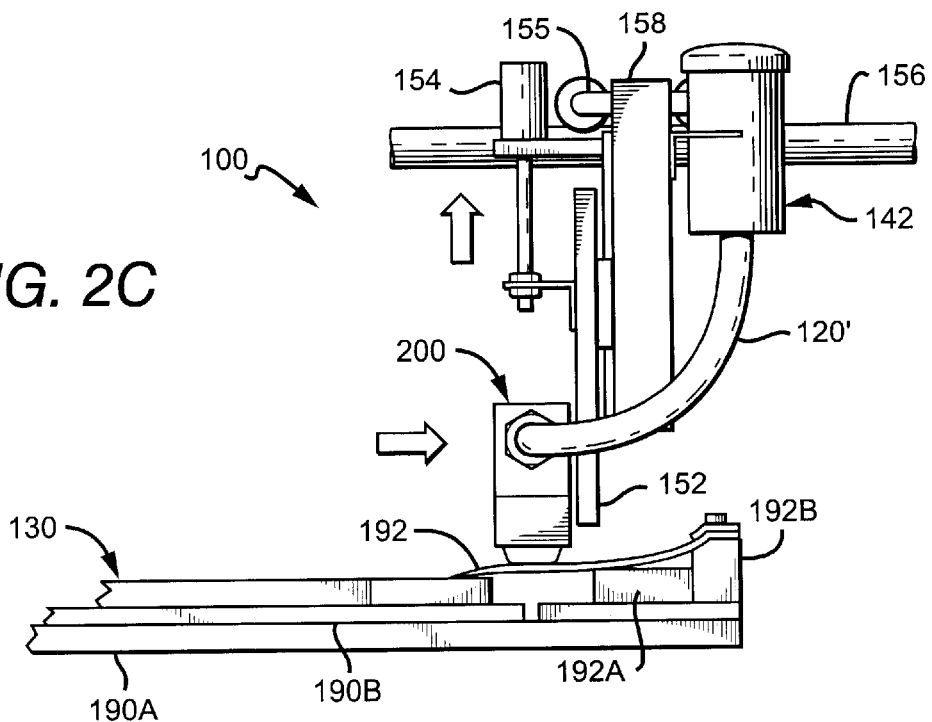
FIG. 2C is a side view of the paste delivery system of FIG. 1 showing a pressure head being moved within a parking zone and being raised away from a substrate.

The control for pressure is actually two way. During a print stroke or when paste is provided to the print head or pressure head 200, pressure is applied to the plunger 186. When a print stroke or pressure is complete, and the print head 200, is moved to a staging or parked area 192 (see FIGS. 2A–2C), and the flow of pressurized fill material 110 is reversed by placing a slight vacuum on the plunger 186 so that the material within the inner casing as well as the paste within the feed line 120 as well as the pressure head 200 retracts slightly. This prevents waste of paste.

Referring to FIG. 10C elements of the embodiments of FIG. 10A and FIG. 10B may be combined in an embodiment which utilize a stepping motor 420 to move a piston 410 having O-ring seal 411 and bleed valve 421. As can be seen, feed tube 120 is coupled to the "bottom" of the chamber 400. The stepping motor 410 moves piston 410 to force fill material 110 out of chamber 400 and through feed tube 120.

Although fill material 110 may comprise any material which can be used to pressure fill the vias of a substrate, it is contemplated that the use of electrically conductive or nonconductive and/or thermally conductive or nonconductive pastes may be particularly advantageous, particularly in instances where the substrate comprises an electronics package member.

Movement Mechanism

The mechanism 150 for moving the pressure head 200 includes a transverse support member 158, a first rail 156 and a second rail 157, coupling members 155, guided head support 152, and head support guide mechanisms 151 comprising bearing block 151A and rail 151B. The mechanism also includes a first pneumatic mover 153 attached to one side of a guided head support 152 and a second pneumatic mover 154 attached to the other side of the guided head support 152. The pneumatic movers 153, 154 are used to control the movement of the pressure head 200 with respect to the support member 158, and are also used to control the amount of force or pressure between the pressure head 200 and the plate 130. Bearing block 151A and rail 151B guide and provide lateral support to guided head support 152. The support member 158 is slidably connected to the first rail 156 and the second rail 157 via coupling members 155.

In alternative embodiments the pressure head 200 can be attached to any common screen-printing machine via a transverse bar on the printers which replaces support member 158.

Figure 2D:
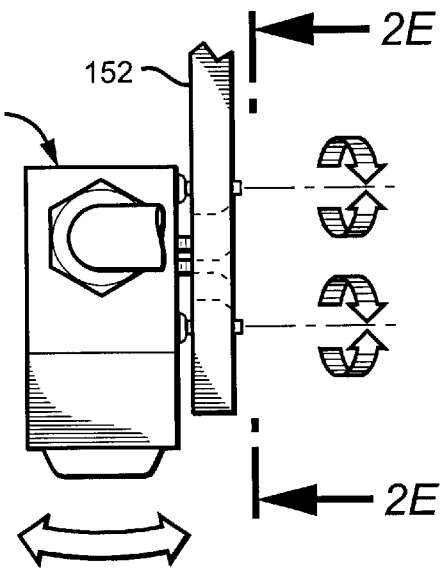
FIG. 2D is a schematic side detail view of the pressure head adjusting mechanisms of FIG. 1.
Figure 2F:
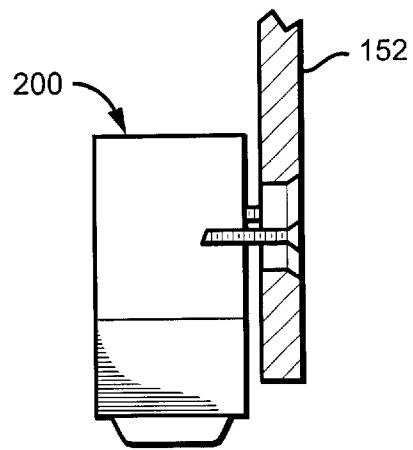
FIG. 2F is a side detail view of the pressure head mounting mechanisms of FIG. 1.
Figure 2E:
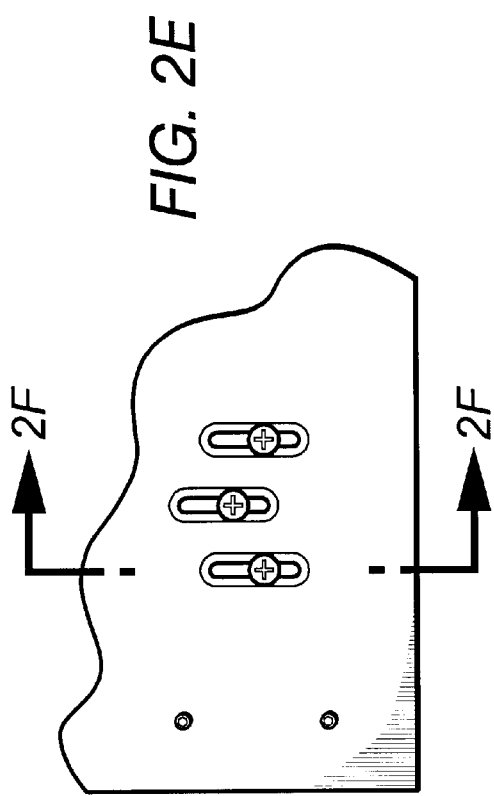
FIG. 2E is a back detail view of the pressure head mounting mechanisms of FIG. 1.

The head 200 must be mounted to the movement mechanism 150 in such a way as to provide uniform planarity with the substrate or surface to be processed. Bearing block 151 A and rail 151 B, by providing lateral support to guided head support 152 help prevent "wobbling" of guided head support 152 as it is moved up and down by movers 153, 154. The orientation of pressure head 200 relative to guided head support 152 is accomplished (referring to FIGS. 2C–2E) via studs/fasteners 161 and leveling screws 162. Studs 161 are preferably screwed into or otherwise fixed in pressure head 210 and extend outward from the head through slots 163 in guided head support 152. Leveling screws 152 are preferably screwed into guided head support 152 and abut pressure head 200. The use of such studs and leveling screws allows the head to be positioned vertically by sliding the studs 161 up and down within slots 163, and allows the orientation of pressure head 200 relative to guided head support 152 to be adjusted through a combination of ration of the leveling screws 162 and tightening the pressure head 200 against the screws 162 via studs/fasteners 161.

Head Parking Mechanism and Substrate Support Structure

Head parking mechanism 190 preferably comprises a ledge 192 having a beveled edge 193, and independently sliding ledge support members 192A and 192B. Ledge 192 may comprise any relatively stiff, flexible material such as a spring steel.

Operation

A substrate 130 is positioned on a support structure 180 (which may comprise a first member 181 coupled to a second member 182 upon which the substrate is positioned), ledge support member 192A is slid up against substrate 130 so as to essentially extend the upper surface of substrate 130 and raise ledge 192 to the height of substrate 130, and ledge support member 192B is slid towards substrate 130 so as to move the edge 193 of ledge 192 off of support member 192B and onto substrate 130. When thus positioned, ledge 192 protects any tooling holes near the edge of substrate 130 which are not to be filled, and provides a mechanism by which the pressure head 200 may be moved onto off of substrate 130 with minimal loss of fill material 110.

Once the substrate is positioned, the pressure head is positioned so that the wear element 230 is in sealing contact with substrate 130 and surrounds one or more vias 132. Positioning the wear element in contact with substrate 130 is accomplished via pneumatic movers 153, 154 which maintain a specific force between the wear element 230 and the substrate 130, and by movement of support member 158 along rails 156, 157.

Pressure is then applied to the source of fill material so as to cause the fill material to flow through feed tubes 120 and 120', through pressure head 200, out opening(s) 340, and into vias 132. More specifically, the pressure mechanism 141 produces a pressure within the feed line 120 which is attached to the pressure head 200. The pressurized paste flows through the feed lines 120, 120' into the flow dispersion regulator 310 in the pressurized chamber 300 of the pressure head 200. The pressure is equalized by the orifices or openings, such as 311, within the flow dispersion regulator 310 in the pressurized chamber 300. After entering the pressurized chamber 300, the paste then flows through the flow-equalizing grid 500 and into the opening 340 in the wear element holding portion 220. From opening 340 it flows against the surface of substrate 130 sealed against head 200 and into vias 132.

As the vias 132 are filled, the pressure head is moved to another location on the electronics package where there are additional vias. Such movement is accomplished as engagement between pressure head 200 and panel 130 and flow of pressurized fill material 10 is maintained, and the support member 158 is moved along the rails 156 and 157 to cause the pressure head 200 to move across the panel 130. As the head 200 remains in engagement with the substrate 130, a more or less continuous amount of pressurized fill material 110 flows from the pressure source through the feed lines 120, 120' and into the pressure head for injection into the vias 132 within the substrate 130.

Movement of pressure head 200 is towards parking ledge 192 of parking mechanism 190. The ledge 192 includes a slight beveled edge 193 so that the head 200 can be moved across the panel and onto the ledge 192 into a park position with minimal loss of fill material. When the head 200 is passed to the park position, the flow of pressurized fill material is reversed (i.e. a vacuum release is applied) to retract any paste that may flow from the pressure head if/when the head is subsequently raised off of the ledge 192.

While the pressure head 200 is positioned on ledge 192, the panel 130 that has filled vias is removed from the support structure 180 and another panel is placed on the support structure 180. The process for filling the vias then repeats.

The fluid pressure of the fill material 110 and vacuum release can be controlled either manually or by tying it to a stop-activated switch set to specific substrate print length. In another embodiment (see FIG. 12A), a machine vision system can be substituted for the stop-activated switches. The machine vision system would produce a signal when the selected via pattern area has been filled.

Use of Pressure Head with an Ultrasonic Driver

Figure 11:
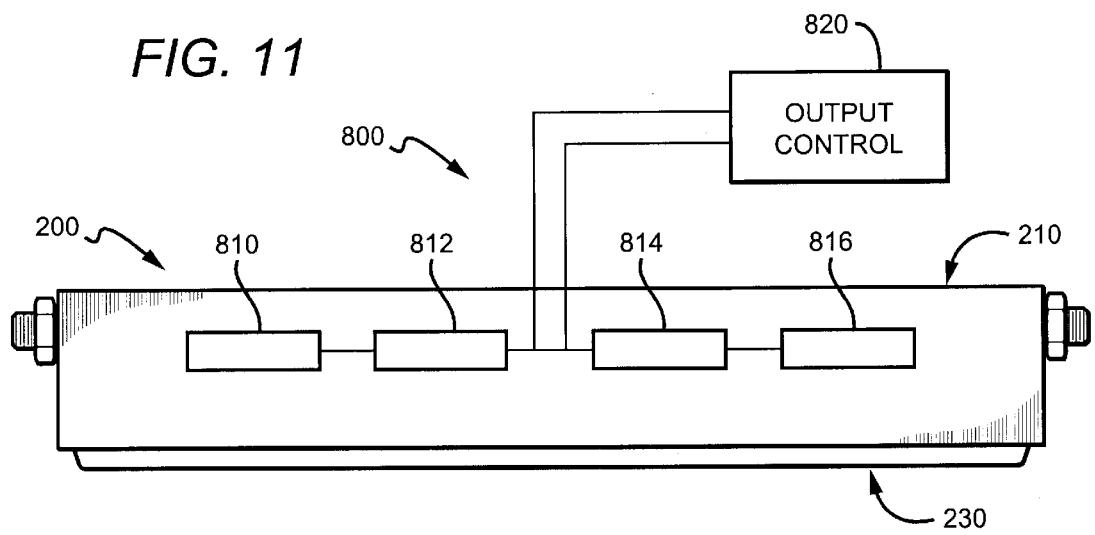
FIG. 11 is a showing a pressure head having a controlled output ultrasonic driver.

FIG. 11 is a schematic showing an embodiment of pressure head 200 having a controlled output ultrasonic driver system 800. Several ultrasonic drivers 810, 812, 814, 816 are attached to the main body 210 of the pressure head 200. Communicatively coupled to the ultrasonic driver is an output control system 820. The output control system 820 provides signals to the ultrasonic driver 810 which regulate the frequency and magnitude of the ultrasonic vibrations provided to the pressure head 200. The output control 820 may include a microprocessor and a feedback loop.

The ultrasonic drivers 810, 812, 814 and 816 are vibrated at a frequency which will not cure the via filling paste 110. By applying ultrasonic vibrations to the via filling paste 110, very high aspect ratio vias 132 may be filled. For example, even with fill materials that are very difficult to process vias 132 having an aspect ration of 12:1 can be filled without ultrasonic drivers 810, 812, 814 and 816, and vias 132 with aspect ratios up to 17:1+ can be filled using the ultrasonic drivers. It is contemplated that even higher aspect ratio vias may be filled using a pressure head 200 provided with ultrasonic drivers 810, 812, 814 and 816. It is believed that very high aspect ratio via filling is also dependent on paste rheology, solids loading, and particle size distribution within the paste.

Structure and Operation of a Bottom Fill Embodiment

Figure 12A:
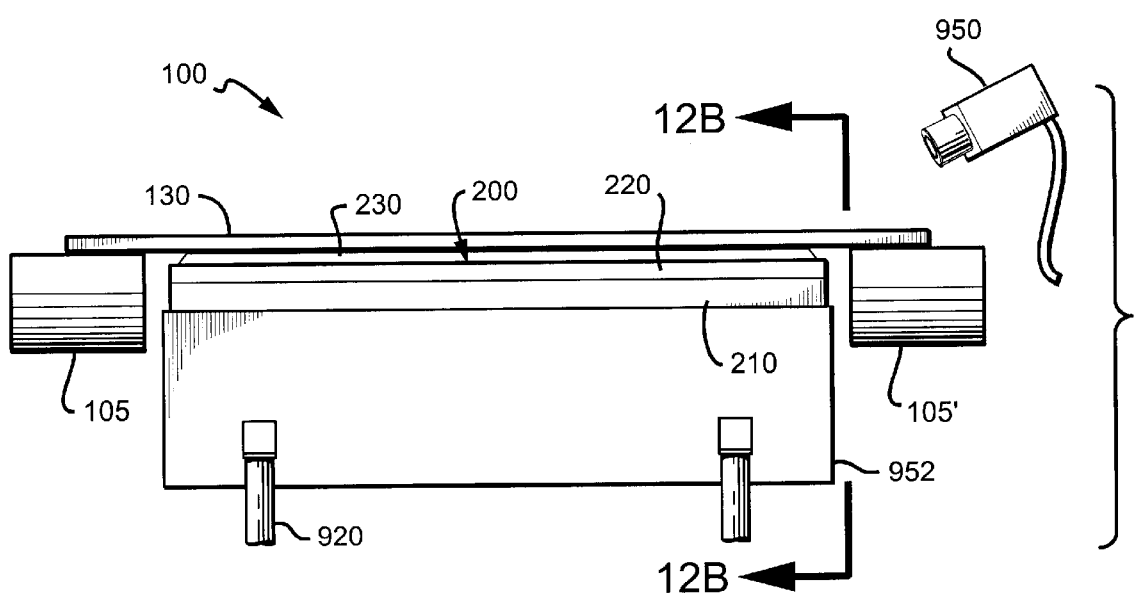
FIG. 12A is a front view of a second embodiment of a paste delivery system.
Figure 12B:
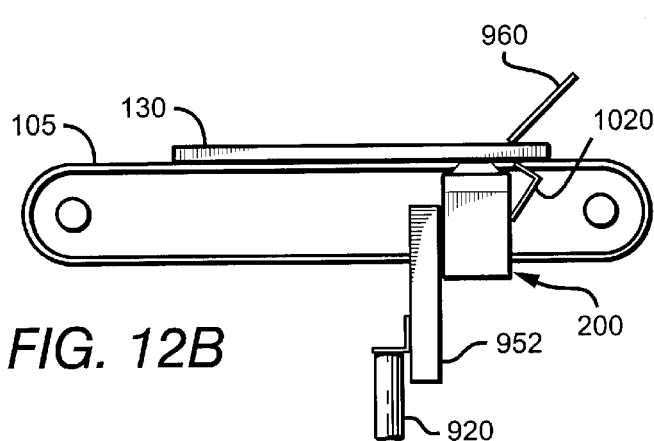
FIG. 12B is a side view of the of the paste delivery system of FIG. 12A.
Figure 12C:
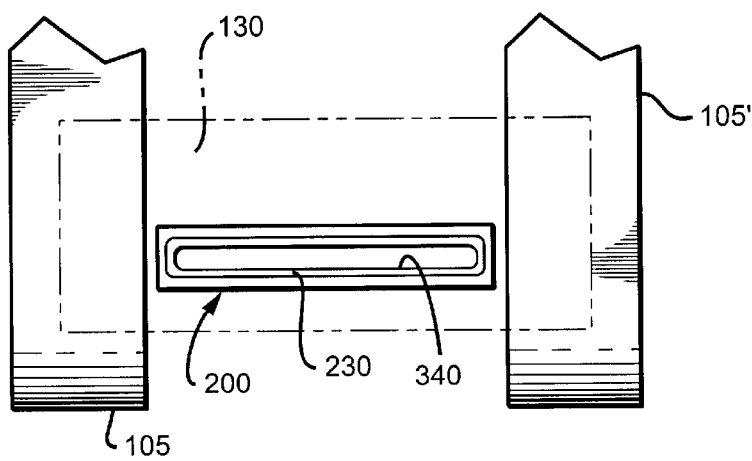
FIG. 12C is a top view of the paste delivery system of FIG. 12A.

In alternative embodiments, pressure head 200 may be positioned so that fill material 110 is forced upwards into vias 132 of substrate 130. One such "bottom fill" embodiment (i.e. a process which requires the via fill paste 110 to overcome the forces of gravity) is shown in FIGS. 12A, 12B, and 12C. In this particular embodiment, a "stationary" pressure head 200 is positioned below a split conveyor having two portions 105, 105'. The panels or electronics packages 130 are pulled over an injection head 200 and then exit on the opposing side where the panel or electronic package is removed and a fresh panel is loaded for via filling in a continuous fashion. This second embodiment will have a high throughput since plates or electronics packages 130 can be continuously fed and filled using this system. The pressure head 200 does not move as much as in the first embodiment. In the second embodiment, the pressure head 200 moves up and down or into and out of engagement with the panel 200. The panels 130 are moved over the pressure head 200 as the vias are filled.

The pressure head raises by activating a pneumatic, two-sided pressure cylinder 920 having adjustable up-and-down travel of approximately 1 to 3 inches to meet the panel surfaces or electronic package 130 surfaces to be filled. The two sided pressure cylinder 920 is attached to a guided head supporting bar 952 as is head 200 A first scavenger blade 960 is positioned on one side of the panel and a second scavenger blade 1020 is positioned on the other side of the panel 130.

Advantageously, a bottom fill process allows in-process observation of fill hole quality and eliminates the need for stop-off sheets, or stand-offs as used for overfill that occurs during top-side filling. Thus, the scavenger blade 960 may not be necessary when using the bottom fill process. The in-process observation of via fill quality can be done by the naked eye or can be observed using a vision system 950 as shown in FIG. 12A. An additional advantage is that there is less possibility for air pockets or voids formed in the vias 132 of the electronics packages or panels 130.

Scavenger blade 1020 is mounted on the pressure head 200 in order to minimize downstream planarizing processes. Planarizing of the entire substrate surface would still normally be required, in order to provide a level surface for subsequent plating processes, i.e. copper capping of the filled vias. It should be noted that the up-and-down or Z direction motion (contact force, the filling pressure (internal head fluid pressure), and cycle speed over the substrate are directly related to the substrate via pattern size, diameter & aspect ratio of the vias to be filled.

Figure 13:
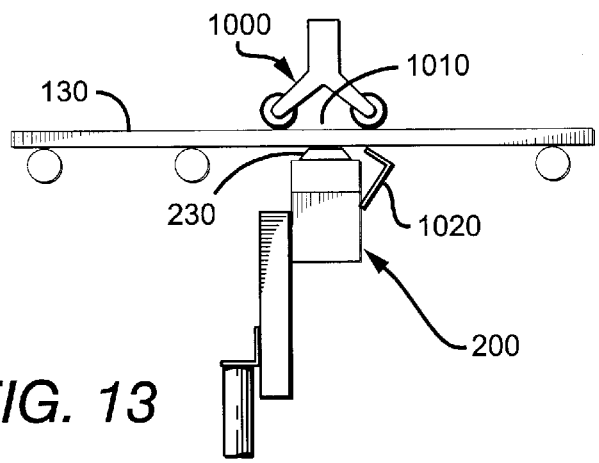
FIG. 13 shows a paste delivery system incorporating a rolling substrate support mechanism.

Now turning to FIG. 13, it can be seen that on the side opposite of the panel, opposite the pressure head 200, a set of rollers or wheels having randomly spaced contact wheel array 1000 between the fill patterns are provided. Wheel arrays 1000 are in immediate proximity to the fill area 1010 of the electronic package or panel 130 being filled. The wheel arrays 1000 prevent or lessen warped or distorted panels that might result in unsupported filling using the pressure head 200.

Structure and Operation of a Stencil-Nested Plate Embodiment

Figure 14:
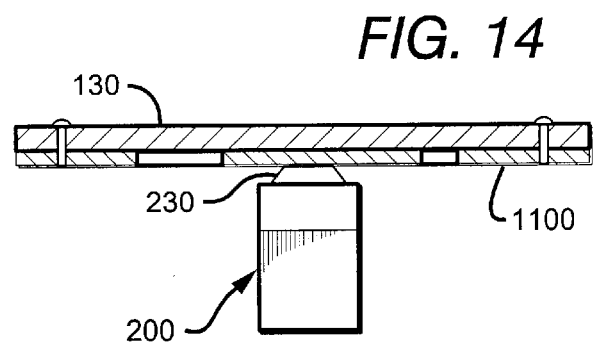
FIG. 14 shows the use of the paste delivery system with a stencil nested plate for patterned panels.

FIG. 14 is a another embodiment of a paste delivery system 100 showing a nested plate 1110 used with a stencil 1100 for patterned substrates 130. Nested plate 1110 mates with a stencil 1100 and has conical tooling pins 1111 to allow a panel or electronics package 130 to be registered to the stencil. The substrate is shuttled through or past a fixed injection head in a similar manner as described in the embodiment of FIGS. 12A, 12B, and 12C. This particular procedure allows for pattern-plated cores and/or finished billed via filling.

Structure and Operation of a Syringe Pressure Source Embodiment

Figure 15:
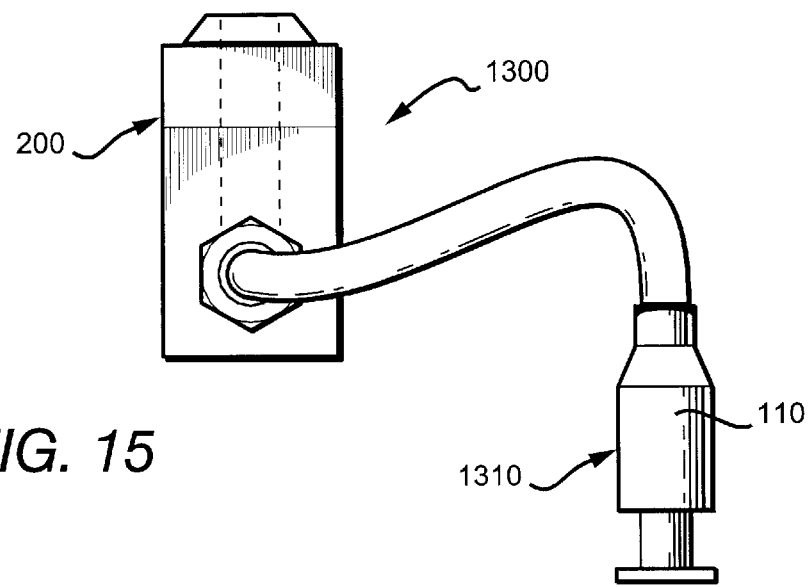
FIG. 15 shows a third embodiment of a paste dispensing system.

FIG. 15 shows yet another embodiment of a paste-dispensing system 1300. In this particular system, via fill paste or via fill paste is within a syringe-type device 1310. Air pressure is used to move or pressurize the via fill paste 110. Such a system might be used for small custom jobs such as building prototype plates. In addition, such a system could be used to provide rework to plates that might contain a slight defect in a via 132 on the plate.

Some Contemplated Advantages

Advantageously, the paste delivery system of the present invention is preferably an apparatus which employs a method for placing via fill paste into via openings in electronic packages so that there are reduced numbers of air pockets formed in the via fill paste while decreasing the amount of processing time required per board, providing for the use of a wider variety of fill materials, and minimizing wastage and contamination of fill material. In addition, if air pockets are formed, the air pockets have less volume than the air pockets or voids formed using other methods. As a result, the apparatus and related process result in plugged vias which are reliable electrical contacts and have favorable thermal characteristics, and the process has improved yields for electronic packages which use plugged vias.

The manufacturing process is controllable and has a relatively high throughput during manufacturing. Such high throughput is obtained by decreasing the amount of process time required per board. Such decreases in many instance scan result in a process time of less than 30 seconds per board.

The device can lessen the chances that contaminates will be introduced into the via fill paste. The reduced chance of introduction of contaminates is contemplated as resulting from providing a sealed flow path for the fill material from the fill material source to the via being filled.

Furthermore, the device and process can also be used to place via fill paste in vias having high aspect ratios and small diameter with added control for filling the vias. Fillable vias 132 can have diameters in the range of 2/1000ths of an inch to 25/1000ths of an inch in diameter. Preferably the diameters are less than 12/1000ths of an inch. More preferably the diameters are less than 8/1000ths of an inch, and most preferably the diameters are less than 6/1000ths of an inch. In addition, the aspect ratio associated with these vias, i.e. the ratio of the via depth divided by the via diameter, that can be filled are from 1:1 to 17:1+, depending on material rheology, paste solids loading, and particle size distribution within the paste used. Preferably the aspect ration is greater than 5:1. More preferably the aspect ratio is greater than 10:1, and most preferably the aspect ration is greater than 12:1.

Advantageously, the fill system utilizes a lower fill material pressure to fill vias. It is contemplated that such successful use of lower pressure may result from the use of a flow grid, a dispersion regulator, and the use of multiple sequential pressure chambers within the fill head. It is also contemplated that the use of a fill material outlets (such as open end 340) which are substantially larger than fill material inlets (such as ends 312 and 314 of the flow dispersion regulator 310) may also contribute significantly to lowering the fill material pressure required to adequately fill the vias. It is possible that the larger outlets and multiple changes in fill material flow direction through the head provided at least in part by the flow grid, dispersion regulator, and multiple sequential pressure chambers coupled with the viscosity of the fill material act to deter flow of the material backwards through the head and possibly thus contribute to a decreased fill material pressure.

It should be noted that substrates 130 can be of any type. For example, plates or electronics packages containing vias may be used even if such plates or packages comprise laminates or ceramics. In addition, vias in wired circuit boards may also be filled using one or more of the embodiments discussed herein.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for filling vias in an electronic substrate comprising:

providing a source of fill material;

providing a pressure head coupled to the source of fill material via a fill material inlet, the pressure head further comprising an elongated fill material outlet which is substantially larger than the fill material inlet;

placing the pressure head in contact with the electronic substrate; and pressurizing the fill material to inject fill material into the vias of the electronic substrate;

wherein the pressure head comprises a pressure chamber and pressurizing the fill material to inject fill material into the vias of the electronic substrate results in fill material flowing into the pressure chamber in a direction away from the substrate being filled;

wherein the pressure chamber is elongated and fill material flows into the pressure chamber from a plurality of inlets spaced along the length of the pressure chamber; and wherein the fill material is hindered from flowing out the fill material outlet from the fill chamber by a resistance member positioned within the pressure chamber between the plurality of inlets and the fill material outlet, the resistance member dividing the pressure chamber into at least two parts.

2. The method of claim 1 wherein the fill material flows through a plurality of openings in the resistance member, the plurality of openings being regularly spaced in an area substantially equal in size to that of the fill material outlet.

3. The method of claim 2 wherein the resistance member is a flow equalization grid spaced adjacent to the fill material outlet.

4. The method of claim 3 further comprising the step of sealing the interface between the pressure head and the electronic substrate by pressing a gasket on the pressure head surrounding the fill material outlet against the electronic substrate.

5. The method of claim 4 further comprising moving the pressure head and electronic substrate relative to each other while maintaining the pressure seal between the pressure head gasket and the electronic substrate and maintaining the pressure of the fill material such that fill material continues to flow into the vias of the electronic substrate.

6. The method of claim 5 wherein the pressure applied to the fill material is less than L pounds per square inch where L is one of 80, 50, 25, 20, 15, and 10.

7. The method of claim 6 wherein the total time required to fill all of the vias of the electronic substrate to be filled is less than T seconds wherein T is one of 20, 30, 40, and 50.

8. The method of claim 7 wherein the movement of the pressure head and electronic substrate relative to each other is a result of holding the pressure head in a fixed position and moving the electronic substrate.

9. The method of claim 8 wherein the electronic substrate is an electronics package and the step of moving the electronic substrate further comprises the steps of:

supporting a first end of the electronics package; and supporting a second end of the electronics package; and wherein the step of placing the pressure head includes placing the pressure head between the first end and the second end of the electronics package and on one side of the electronics package.

10. The method of claim 9 further comprises the step of supporting a side of the electronics package opposite the electronic substrate to prevent damage to the electronics package by placement of the pressure head.

11. The method of claim 10 wherein the step of placing the pressure head includes placing the pressure head such that paste entering a via must overcome gravitational forces.

12. The method of claim 11 further comprising the step of observing the paste with an automated machine vision system as it fills a via from the opposite side where the pressure head is placed.

13. The method of claim 10 further comprising ultrasonically vibrating the fill material and/or the pressure head while injecting fill material into the vias of the electronic substrate.

14. A method for filling vias in an electronic substrate comprising:

providing a pressure head having an elongated pressure chamber and a fill material outlet;

forcing fill material into the pressure chamber through a plurality of inlets spaced along the length of the pressure chamber, out the fill material outlet, and into at least one via of the electronic substrate.

15. The method of claim 14 further comprising forcing the fill material in the pressure chamber to flow through a flow equalization grid spaced adjacent to the fill material outlet and then out of the pressure head through the fill material outlet.

* * * * *